US012761096B2

(12) United States Patent
Zheng et al.

(10) Patent No.: US 12,761,096 B2
(45) Date of Patent: Oct. 13, 2026

(54) HIGH TEMPERATURE PIEZO-RESISTIVE PRESSURE SENSOR AND PACKAGING ASSEMBLY THEREFOR

(71) Applicant: Rosemount Aerospace Inc., Burnsville, MN (US)

(72) Inventors: Jun Zheng, Edina, MN (US); Weibin Zhang, Burnsville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 633 days.

(21) Appl. No.: 18/118,809

(22) Filed: Mar. 8, 2023

(65) Prior Publication Data

US 2024/0302237 A1 Sep. 12, 2024

(51) Int. Cl.
*G01L 9/00* (2006.01)
*B81B 7/00* (2006.01)
*G01L 19/14* (2006.01)

(52) U.S. Cl.
CPC .......... *G01L 9/0052* (2013.01); *B81B 7/0041* (2013.01); *G01L 19/147* (2013.01); *B81B 2201/0264* (2013.01); *B81B 2203/0127* (2013.01); *B81B 2203/0315* (2013.01)

(58) Field of Classification Search
CPC ... G01L 9/0052; G01L 19/147; G01L 9/0042; G01L 9/0048; G01L 9/0055; G01L 19/0069; G01L 19/0084; G01L 9/0047; B81B 7/0041; B81B 2201/0264; B81B 2203/0127; B81B 2203/0315
See application file for complete search history.

(56) References Cited

U.S. PATENT DOCUMENTS 5,600,071 A * 2/1997 Sooriakumar ........ G01L 19/147 73/721
7,622,782 B2 11/2009 Chu et al.
7,952,154 B2 5/2011 Guo et al.
7,998,777 B1 8/2011 Gamage et al.
8,316,533 B2 11/2012 Suminto et al.
8,384,168 B2 2/2013 Hooper et al.
2013/0276544 A1* 10/2013 Potasek ................. B81B 7/0048 73/715
2018/0148316 A1* 5/2018 Duqi ......................... G01L 1/26

OTHER PUBLICATIONS

European Search Report received in EP Application No. 24161954.3, Nov. 18, 2024, 13 pages.

* cited by examiner

*Primary Examiner* — Jacob Y Choi
*Assistant Examiner* — Grace Cha
(74) *Attorney, Agent, or Firm* — Suiter Swantz IP

(57) ABSTRACT

A packaged pressure sensor assembly is disclosed that includes a pressure sensor including an upper substrate and a lower substrate bonded to one another by way of a first glass frit having a first bonding temperature, so as to define a hermetically sealed pressure sensing chamber therebetween, and a housing defining an internal cavity having a base with a support surface for supporting the pressure sensor, wherein the pressure sensor is bonded to the support surface of the base by a second glass frit having a second bonding temperature that is lower than the first bonding temperature.

14 Claims, 9 Drawing Sheets

HIGH TEMPERATURE PIEZO-RESISTIVE PRESSURE SENSOR AND PACKAGING ASSEMBLY THEREFOR

BACKGROUND OF THE DISCLOSURE

1. Field of the Disclosure

The subject disclosure is directed to pressure sensors, and more particularly, to a high temperature piezo-resistive pressure sensor and a packaging assembly for a high temperature piezo-resistive pressure sensor.

2. Description of Related Art

MEMS pressure sensors have a wide range of useful applications in many commercial and industrial systems including aerospace, automotive, oil and gas drilling and consumer electronics. In most applications, MEMS pressure sensors convert a pressure signal to an electrical signal through a piezo-resistive effect. This sensing principle has significant advantages when employed in high temperature environments in terms of stability, signal processing convenience and accuracy.

In a high temperature environment, not only does the pressure sensor and its individual components have to survive and function correctly, the sensor packaging assembly must also be designed to withstand high operating temperatures. It would be beneficial to provide a piezo-resistive pressure sensor and a packaging assembly therefor that can perform reliably in a high temperature operating environment.

SUMMARY OF THE DISCLOSURE

The subject disclosure is directed to a new and useful packaging assembly and method for a piezo-resistive pressure sensor that is suitable for use in a wide variety of high-temperature applications and environments including aerospace, consumer electronics, oil and gas drilling and industrial controls.

The assembly includes a pressure sensor having an upper substrate and a lower substrate that are bonded to one another by way of a first glass frit having a first bonding temperature, so as to define a hermetically sealed pressure sensing chamber therebetween. The assembly further includes a housing defining an internal cavity having a base with a support surface for supporting the pressure sensor. Preferably, the housing is formed from a stainless steel material and the base is formed from a material such as Kovar (an iron-nickel-cobalt alloy) or the like.

The pressure sensor is bonded to the support surface of the base by a second glass frit having a bonding temperature that is lower than the bonding temperature of the first glass frit. In an embodiment of the subject disclosure, the lower substrate of the pressure sensor is bonded to a compliant pedestal substrate by way of a third glass frit having a bonding temperature equal to the bonding temperature of the first glass frit. The pedestal substrate provides a stress buffer for the pressure sensor.

A diaphragm is operatively associated with the pressure chamber for converting a mechanical stress to an electrical signal indicative of a sensed pressure. The diaphragm has at least a piezo-resistive layer thereon made from a single silicon material or a polysilicon material. Alternatively, the diaphragm may be made entirely from a single silicon material or a polysilicon material. In certain embodiments of the subject disclosure, the pressure sensor and the housing are adapted and configured to sense an absolute pressure. In other embodiments of the subject disclosure, the pressure sensor and the housing are adapted and configured to sense a differential pressure.

The housing of the packaging assembly includes a pair of electrical connectors for electrically communicating with the diaphragm. In certain embodiments of the subject disclosure, bonding wires extend between the electrical connectors of the housing and a conductive bond pad associated with the upper substrate, and the conductive bond pad communicates with electrical conductors connected to the diaphragm by way of a metallic layer deposited between the upper and lower substrates outboard from the first glass frit. The metallic layer has a melting temperature that is less than the first bonding temperature. The metallic layer is formed from an alloy such as, for example, a gold alloy or the like, having a melting temperature that is less than the first bonding temperature.

In another embodiment of the subject disclosure, bonding wires extend between the electrical connectors of the housing and a conductive bond pad associated with the upper substrate, and the conductive bond pad communicates with electrical conductors connected to the diaphragm by way of separate bonding wires outboard from the first glass frit. In yet another embodiment of the subject disclosure, bonding wires extend between the electrical connectors of the housing and electrical conductors connected to the diaphragm outboard from the first glass frit.

The subject disclosure is also directed to a high-temperature pressure sensor that includes an upper substrate, a lower substrate bonded to the upper substrate by way of a glass frit so as to define a hermetically sealed pressure sensing chamber therebetween, a diaphragm operatively associated with the pressure chamber for converting a mechanical stress to an electrical signal indicative of a sensed pressure, and a metallic layer deposited between the upper substrate and the lower substrate outboard from the glass frit. The metallic layer is electrically connected to the diaphragm and to a conductive bond pad associated with the upper substrate. In certain embodiments of the subject disclosure, the pressure sensor is adapted and configured to sense an absolute pressure. In other embodiments of the subject disclosure, the pressure sensor is adapted and configured to sense a differential pressure.

In an embodiment of the subject disclosure, the lower substrate of the pressure sensor is bonded to a compliant pedestal substrate by way of a glass frit having a bonding temperature equal to the bonding temperature of the glass frit glass frit used to bond the upper and lower substrates together. The pedestal substrate provides a stress buffer for the pressure sensor. The metallic layer is a gold alloy or the like having a melting temperature that is less than the bonding temperature of the glass two frits, and the diaphragm has at least a piezo-resistive layer thereon made from a single silicon material or a polysilicon material.

These and other features of the high-temperature piezo-resistive pressure sensor of the subject disclosure of the packaging assembly therefor will become more readily apparent from the following detailed description of the preferred embodiments taken in conjunction with the drawings.

BRIEF DESCRIPTION OF THE DRAWINGS

So that those skilled in the art will readily understand how to make and use the pressure sensors of the subject disclosure without undue experimentation, embodiments thereof will be described in detail herein below with reference to the figures wherein.

DETAILED DESCRIPTION OF THE EMBODIMENTS

Figure 1:
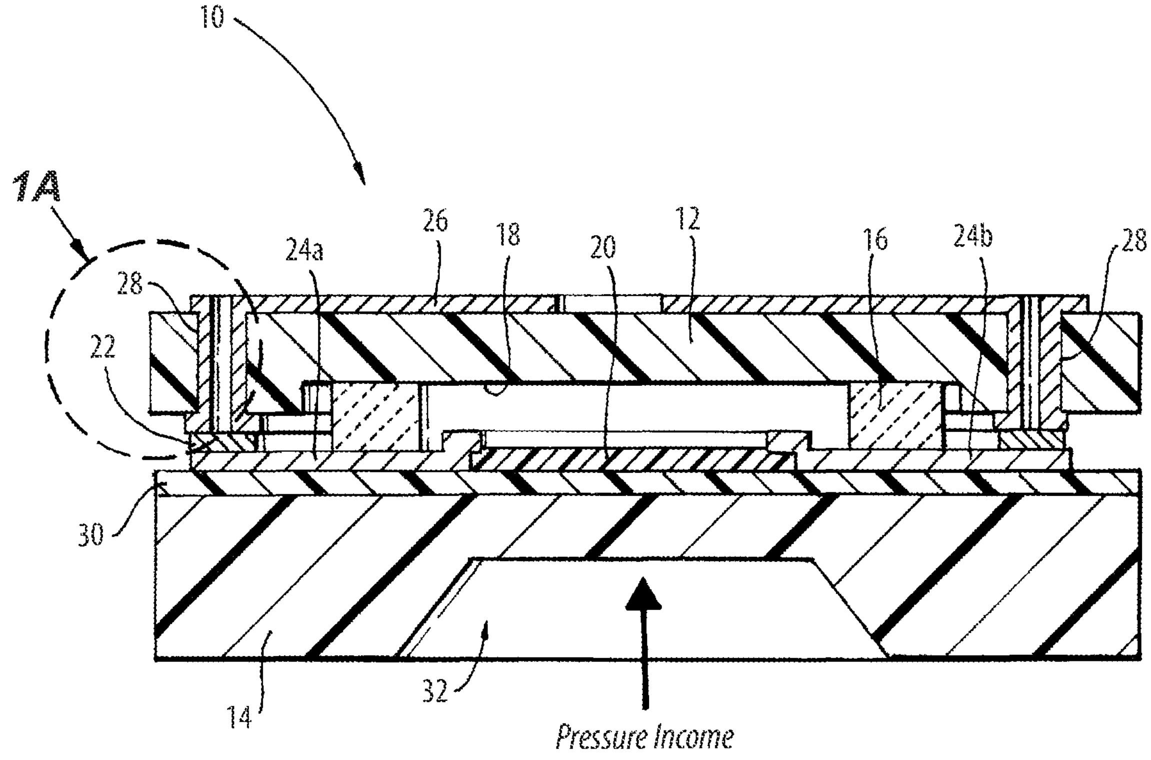
FIG. 1 is a cross-sectional view of a pressure sensor constructed in accordance with the subject disclosure, which is configured for absolute pressure sensing.

Referring now to the drawings wherein like reference numeral identify similar features or components of the subject disclosure, there is illustrated in FIG. 1, a high-temperature pressure sensor constructed in accordance with an embodiment of the subject disclosure and designated generally by reference numeral 10. Pressure sensor 10 is a MEMS device fabricated as a die in a wafer batch process. Those skilled in the art will readily appreciate that this provides a significant manufacturing cost benefit.

Referring to FIG. 1, pressure sensor 10 includes an upper substrate 12, a lower substrate 14 bonded to the upper substrate 12 by way of a glass frit 16 so as to define a hermetically sealed pressure sensing chamber 18 between the two substrates. The upper and lower substrates 12, 14 are preferably formed from Silicon (Si) or a similar material.

A piezo-resistive diaphragm 20 is operatively associated with the pressure chamber 18 for converting a mechanical stress to an electrical signal indicative of a sensed pressure. The diaphragm 20 has at least a piezo-resistive upper layer thereon made from a single crystal silicon material or a polysilicon material. Alternatively, the diaphragm 20 may be made entirely from a single crystal silicon material or a polysilicon material.

Figure 1A:
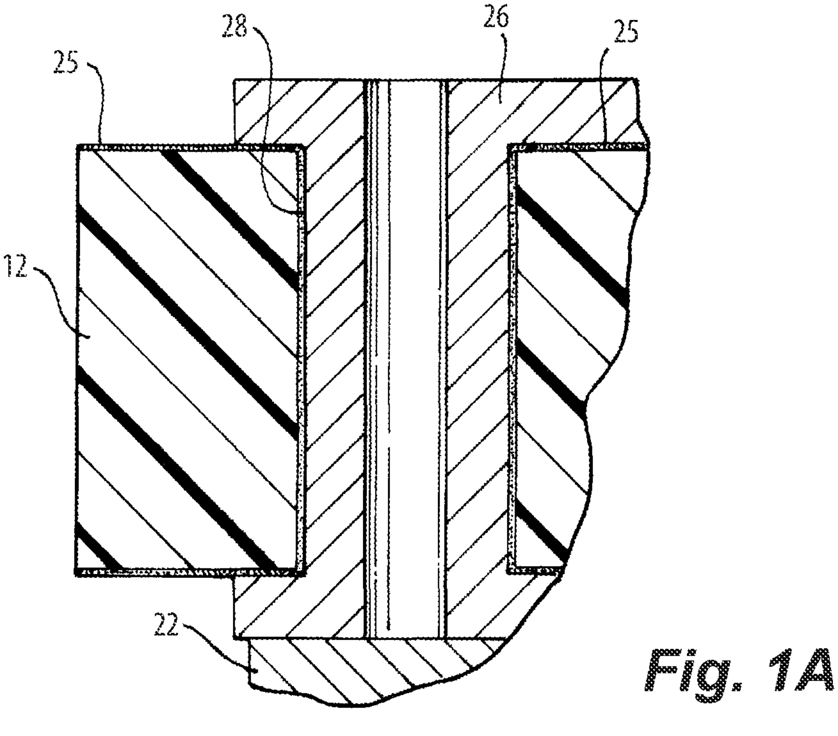
FIG. 1A is an enlarged localized view from FIG. 1 showing the passivation layer deposited on the surfaces of the upper substrate.

A patterned metallic layer 22 is deposited between the upper substrate 12 and the lower substrate 14 outboard from the glass frit 16. The metallic layer 22 is electrically connected to the diaphragm 20 by way of metal connectors 24*a*, 24*b* and to a conductive bond pad 26 that is associated with the upper substrate 12. More particularly, the conductive bond pad 26, which his deposited on the top surface of the upper substrate 12 extends through a series of passages or vias 28 that are outboard from the pressure chamber 18, so as to connect with the metallic layer 22. As best seen in FIG. 1A, a passivation layer 25 is deposited around all the surfaces of the upper substrate 12 associated with the bond pad 26, including the vias 28.

The patterned metallic layer 22 has a melting temperature that is less than the bonding temperature of the glass frit 16. Thus, it will advantageously melt and form a conductive path between the bond pad 26 and the connectors 24*a*, 24*b* before the glass frit 16 begins to melt.

Preferably, the patterned layer 22 is a gold-tin alloy (AuSn) which will begin to melt at 280° C. and the glass frit 16 is formed from a material that has a bonding temperature of about 400° C. These dual bonding materials will achieve both hermetic vacuum sealing and electrical connection. More particularly, the glass frit bonding achieves the vacuum and the AuSn bonding achieves the electrical connection.

Adhesion and barrier layers are preferably associated with piezo-resistive diaphragm 20 and the patterned AuSn layer. The barrier layer could be Nickel (Ni) and the adhesion layer could be Chromium (Cr) or Zirconium (Zr). Preferably, a dielectric insulation layer 30 is deposited on the top surface of the lower substrate, beneath the diaphragm, and the connectors 24*a*, 24*b*. This insulation layer can be Silicon Oxide ($SiO_2$), Silicon Nitride (SiN) or both.

Pressure sensor 10 is adapted and configured to sense an absolute pressure. More particularly, there is a recessed cavity 32 etched into the bottom surface of the lower substrate 14 for pressure income. The incoming pressure exerts a force on the substrate 14, within the cavity 32, below the diaphragm 20. This causes the diaphragm 20 to deflect, which in turn generates a mechanical stress on the piezo-resistive surface layer of the diaphragm 20. More particularly, the piezo-resistive surface layer defines a Wheatstone bridge circuit that converts the mechanical stress to an electrical signal indicative of an absolute pressure measurement.

Figure 2:
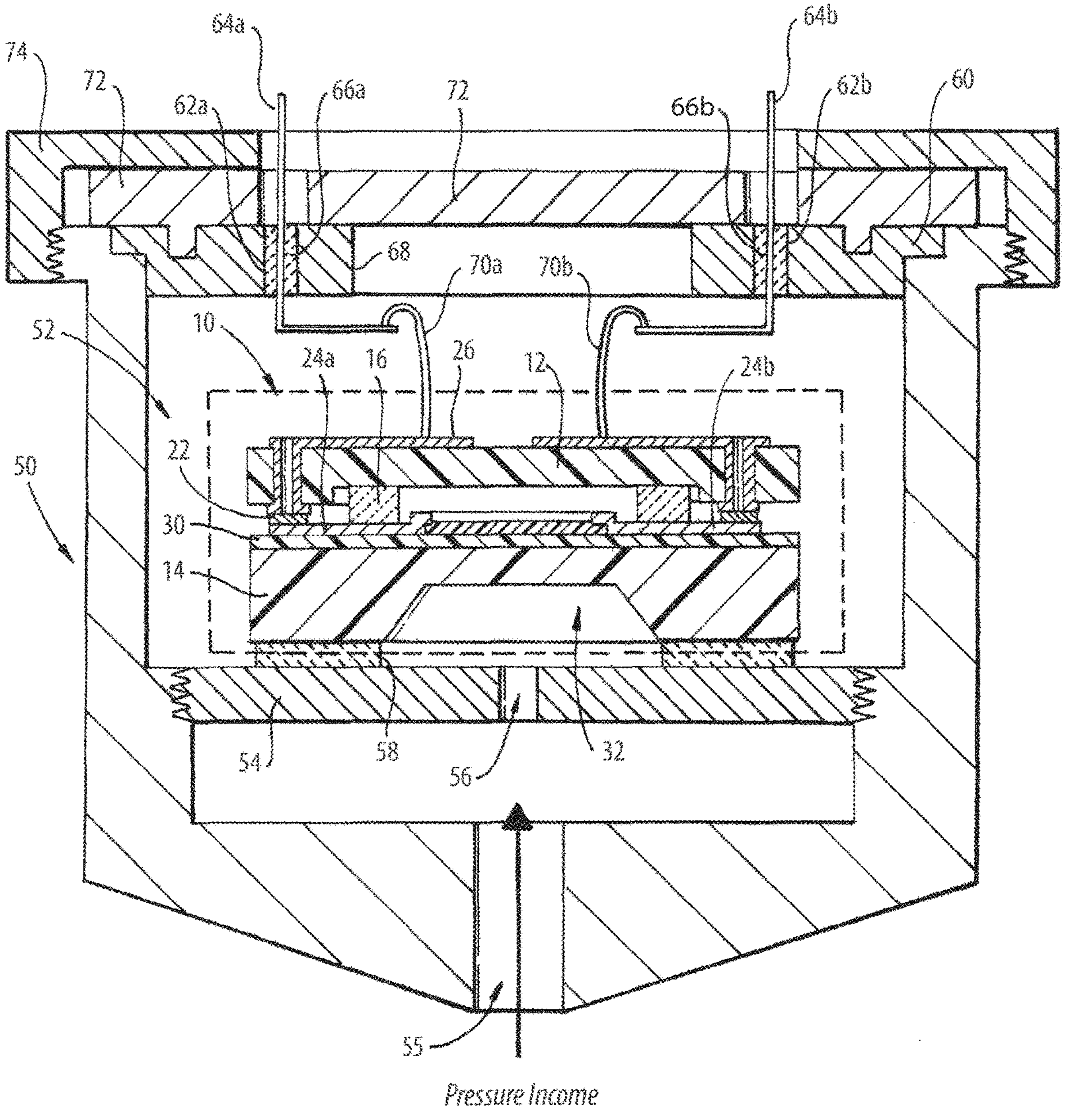
FIG. 2 is a cross-sectional view of the pressure sensor of FIG. 1 packaged in a housing assembly.

Referring now to FIG. 2, the pressure sensor 10 is packaged with a housing 50, which his preferably made from a stainless steel material. The housing 50 is generally cylindrical in shape and has an interior cavity 52 for receiving the pressure sensor 10. More particularly, there is a base 54 for supporting the sensor 10 within the interior cavity 52 of housing 50. The base 54 has a disc-like shape and is made of Kovar® (i.e., an alloy of nickel, cobalt and iron) or a similar alloy, and it is threaded into the cavity 52 and subsequently spot welded or brazed in place during assembly to make a sealed connection. A central port 56 extends through the base 54 to communicate with the recessed cavity 32 etched into the bottom surface of the lower substrate 14. The central port 56 communicates with a pressure port 55 formed in the bottom of housing 50.

Once the base 54 is secured, the pressure sensor 10 is bonded to the upper surface of thereof by a second glass frit 58, which has a bonding temperature that is lower than the bonding temperature of the glass frit 16 that hermetically bonds the upper substrate 12 to the lower substrate 14 during the die fabrication process. Thus, during package assembly, the first glass frit 16 will not reflow. It should be understood that the maximum operating temperature of the packaged sensor assembly will be effectively limited by the bonding temperature of the second glass frit 58. However, by proper material selection this temperature can withstand operating temperatures of 350° C. or more. Moreover, because the package assembly is constructed from materials, such as Kovar® and stainless steel, it can tolerate operating temperatures of 350° C. or more without concern.

After securing the pressure sensor 10 to the supporting surface of the base 54, a stainless steel ring 60 is welded to the top of the housing 50. The ring 60 has a pair of through bores 62*a*, 62*b* to accommodate a pair L-shaped external electrical connection pins 64*a*, 64*b*. Glass insulators 66*a*, 66*b* support the pins 64*a*, 64*b* within bores 62*a*, 62*b*.

A central access port 68 is formed in the ring 60 to enable electrical connection of the connector pins 64*a*, 64*b* to the conductive bond pad 26 on the upper substrate 12 by way of bond wires 70*a*, 70*b*. A stainless steel spacer disc 72 is installed above ring 60 to close the central access port 68 in the disc 60. Thereafter, a final ring clamp 74 is threaded to the top of the housing 50 to secure all of the packaging components of together and finish the assembly. It is envisioned that the interior cavity 52 of housing 50 could be filled with filling material, such as Ecofoam®, to stabilize the bonding wires 70*a*, 70*b*.

Figure 3:
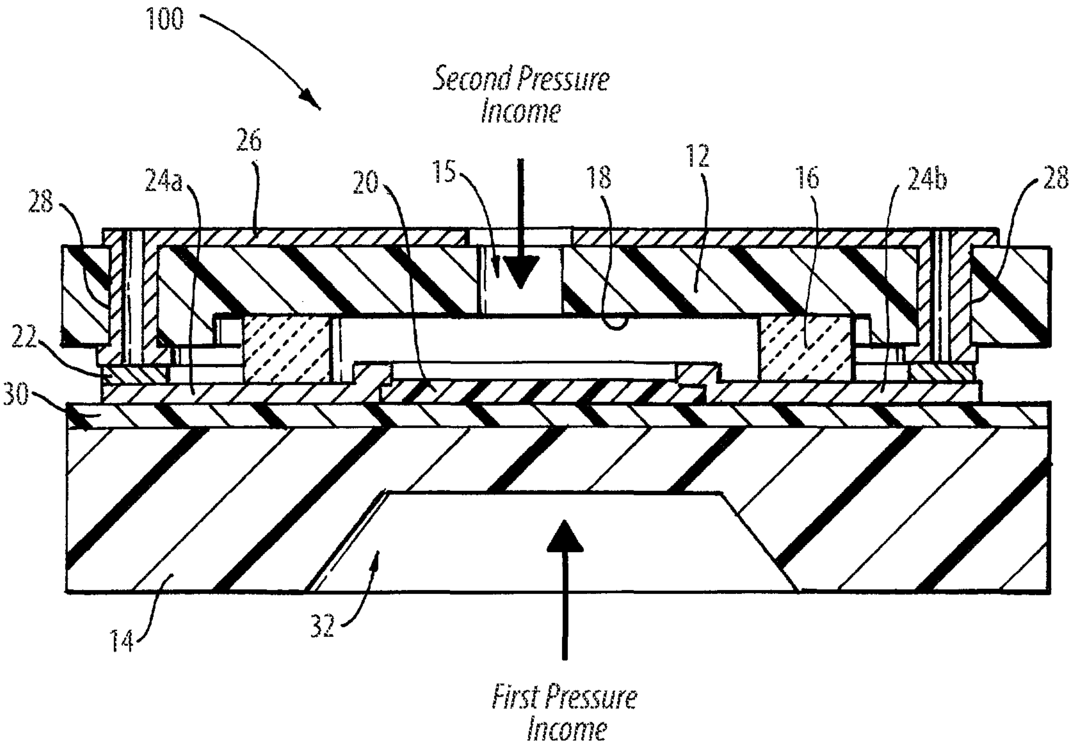
FIG. 3 is a cross-sectional view of a pressure sensor constructed in accordance with the subject disclosure, which is configured for differential pressure sensing.
Figure 4:
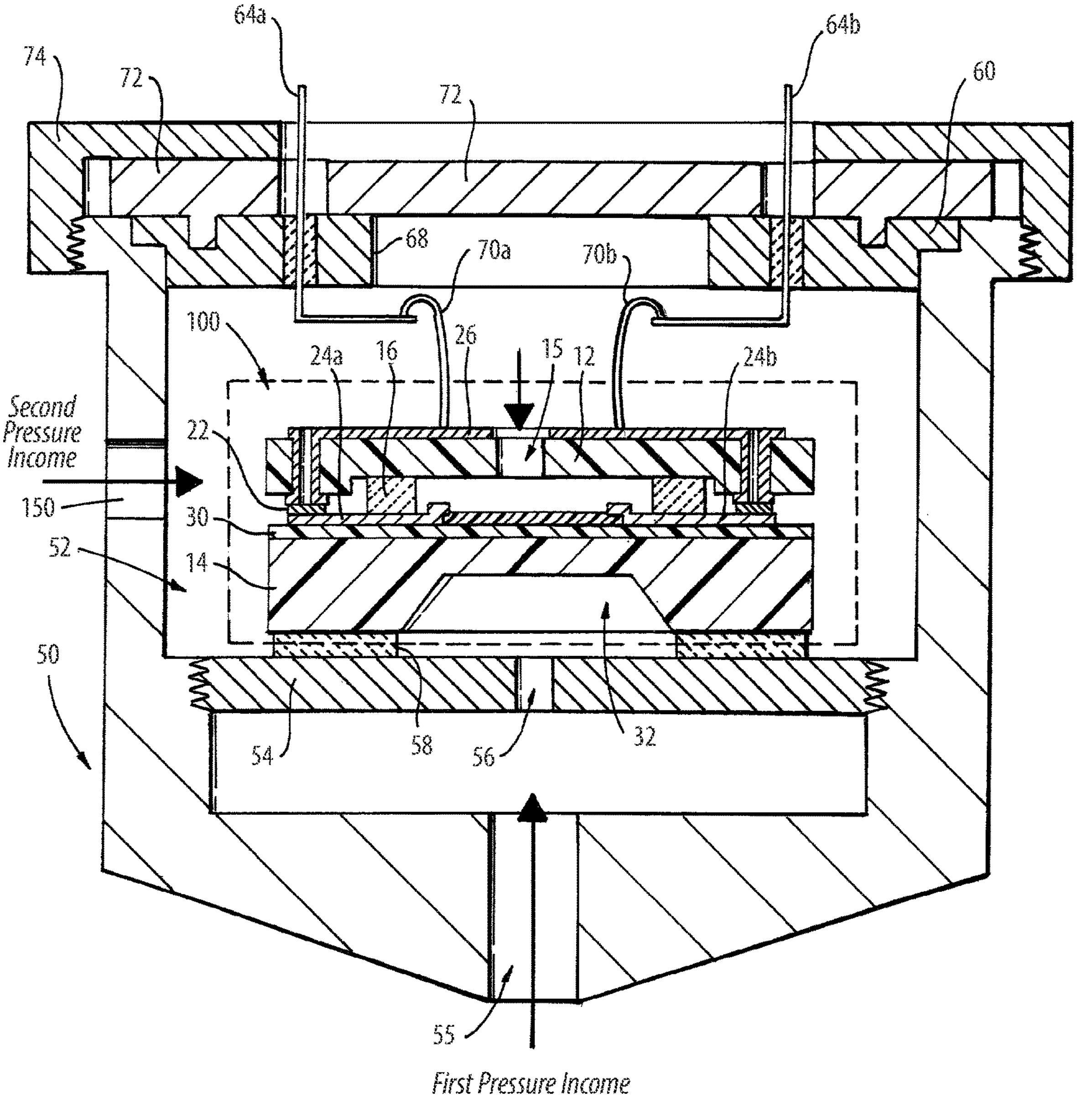
FIG. 4 is a cross-sectional view of the pressure sensor of FIG. 3 packaged in a housing assembly.

Referring now to FIG. 3, there is illustrated another embodiment of a high-temperature pressure sensor designated generally by reference numeral 100, that is substantially identical to the pressure sensor 10 described above and shown in FIGS. 1 and 2, except that pressure sensor 100 is adapted and configured to sense a differential pressure. Thus, in addition to the recessed cavity 32 etched into the bottom surface of the lower substrate 14 for pressure income, there is a pressure port 15 formed in the upper substrate 12 providing direct communication with the pressure chamber 18 for a second incoming pressure. Accordingly, the stainless steel housing 50 within which pressure sensor 100 is packaged has a second pressure port 150 provided in a side wall thereof, as shown in FIG. 4.

Figure 5:
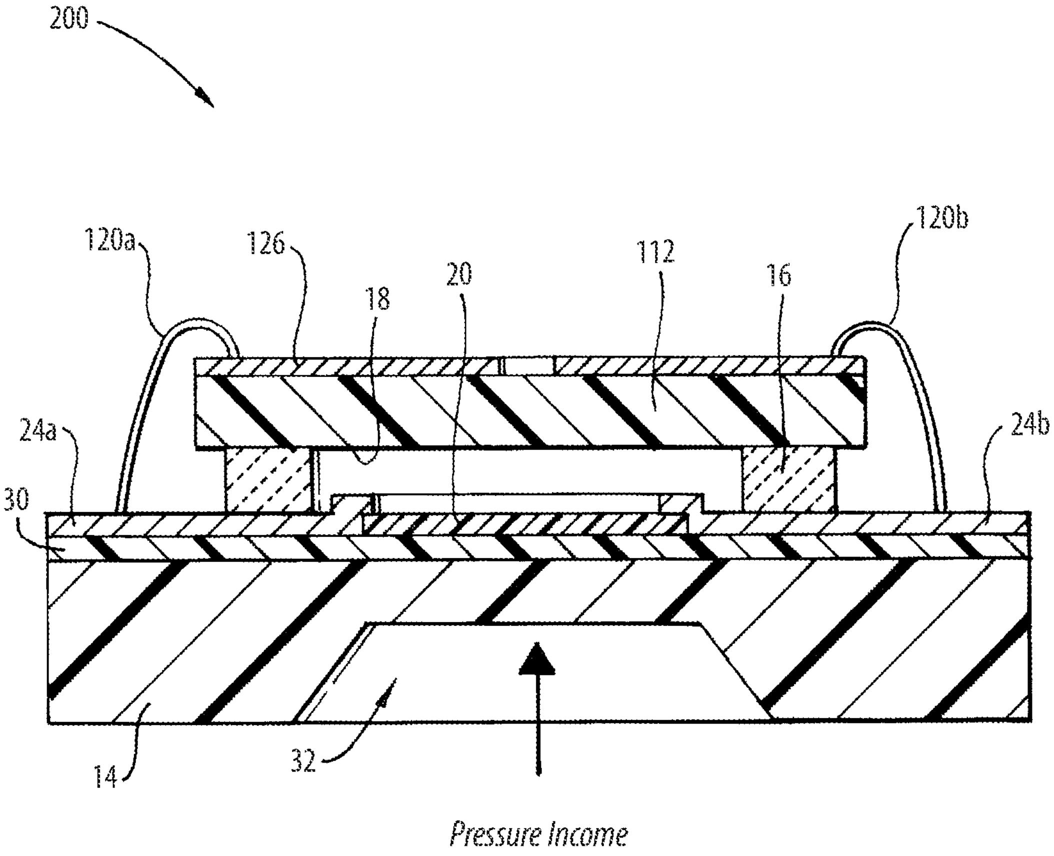
FIG. 5 is a cross-sectional view of another pressure sensor constructed in accordance with the subject disclosure, which is configured for absolute pressure sensing.

Referring now to FIG. 5, there is shown another high-temperature pressure sensor constructed in accordance with the subject disclosure, which is configured for absolute pressure sensing and is designated generally by reference numeral 200. Pressure sensor 200 is similar to pressure sensor 10, but it includes a smaller upper substrate 112 that is electrically bonded to the connectors 24*a*, 24*b* on the lower substrate 14 by separate bonding wires 120*a*, 120*b*, rather than by way of a deposited gold alloy layer. More particularly, the bond wires 120*a*, 120*b* extend between a conductive bond pad 126 on the upper substrate 112 and the connectors 24*a*, 24*b* on the lower substrate 14.

Figure 6:
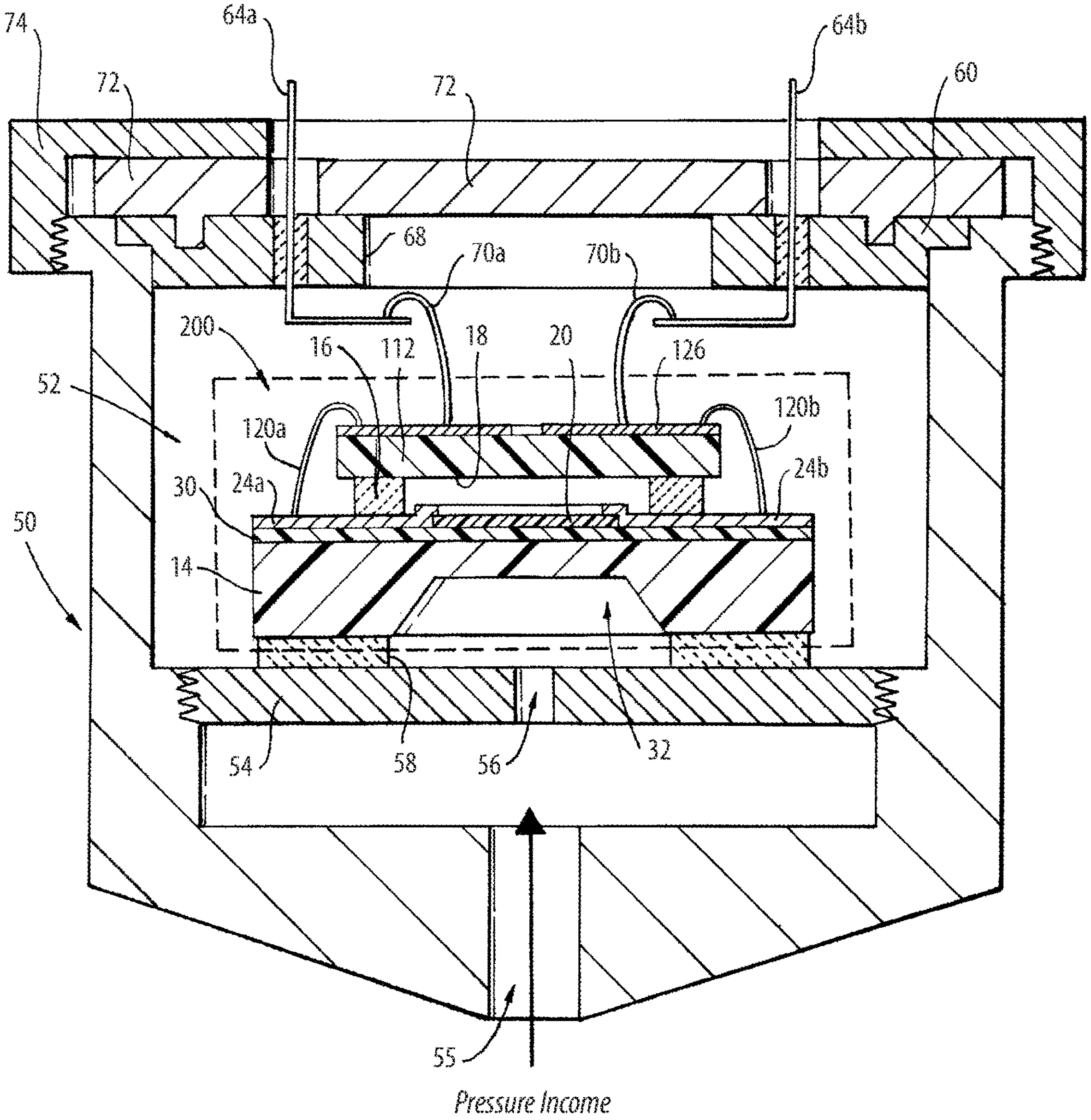
FIG. 6 is a cross-sectional view of the pressure sensor of FIG. 5 packaged in a housing assembly, having a first arrangement of bonding wires.

FIG. 6 shows the pressure sensor 200 packaged within a stainless steel housing 50 in the same manner as described above with respect to pressure sensor 10. In this regard, bond wires 70*a*, 70*b* connect the bond pad 126 on upper substrate 112 to connector pins 64*a*, 64*b*. This assembly process is performed through the central access port 68 in the disc 60.

Figure 7:
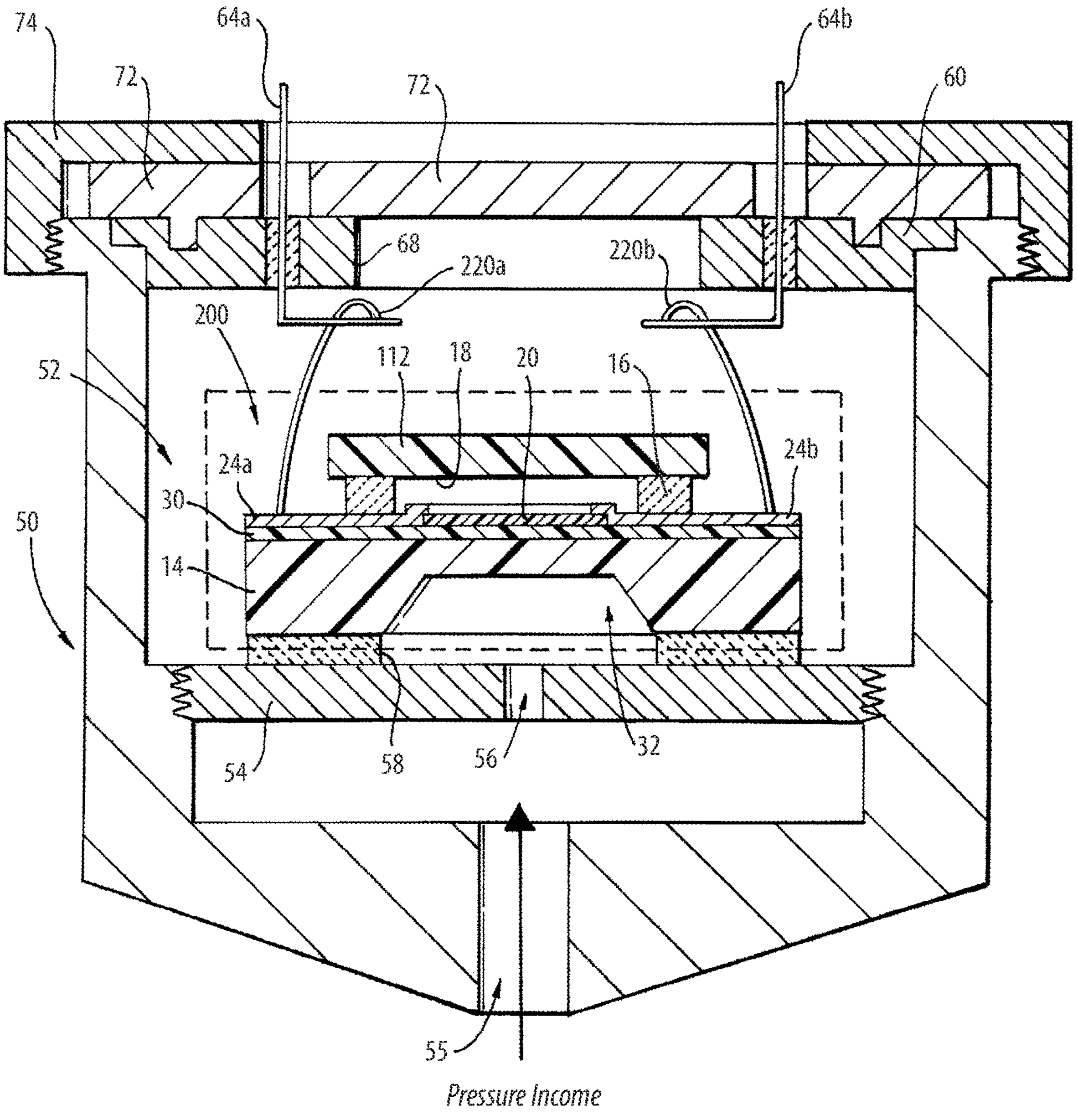
FIG. 7 is a cross-sectional view of the pressure sensor of FIG. 5 packaged in a housing assembly, having a second arrangement of bonding wires.

FIG. 7 also shows the pressure sensor 200 packaged within a stainless steel housing 50, but in this embodiment, the electrical connectors 24*a*, 24*b* on the lower substrate 14 are directly connected to the connector pins 64*a*, 64*b* by way of bonding wires 220*a*, 220*b*. Consequently, in this embodiment, there is no metal bond pad associated with the upper substrate 112. However, this is a slightly more difficult assembly process, given the size and location of central access port 68.

Figure 8:
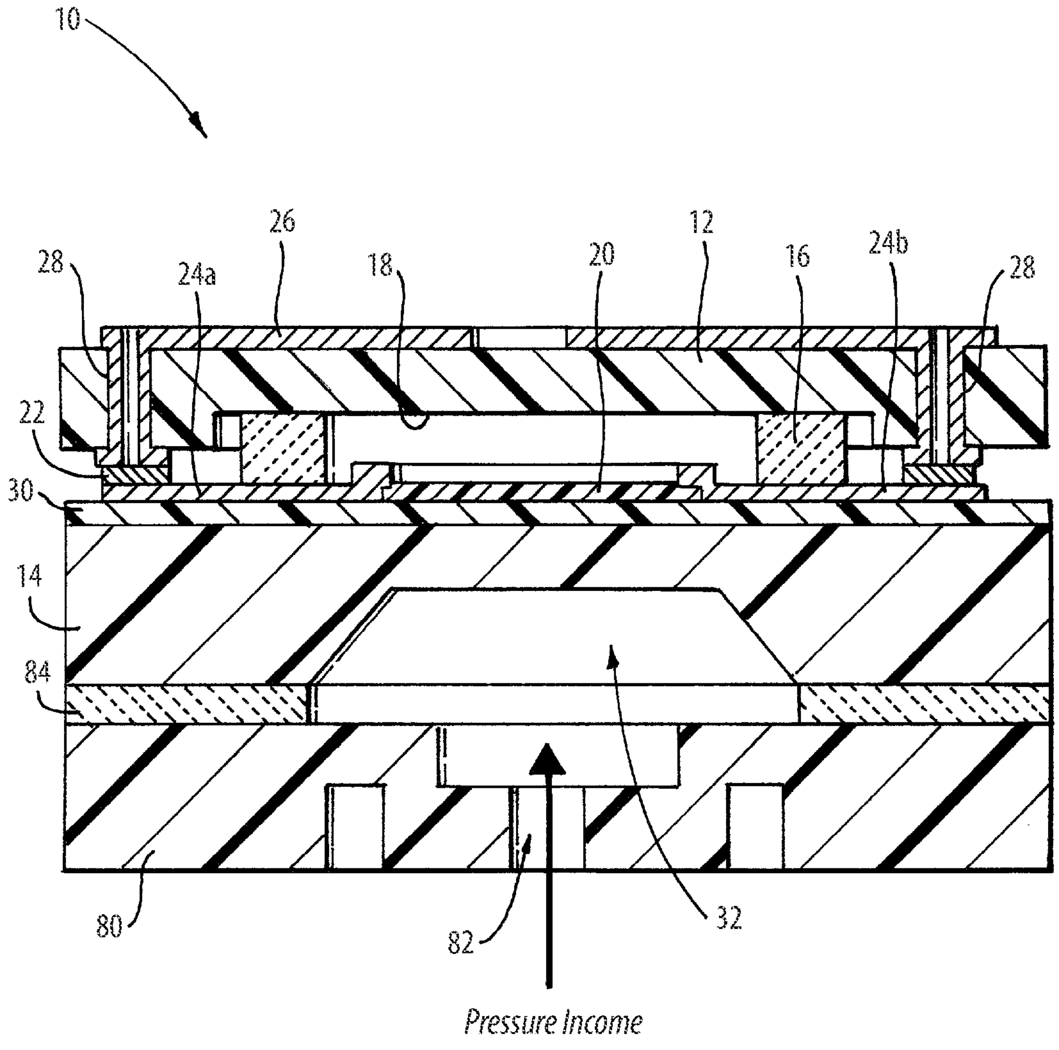
FIG. 8 is a cross-sectional view of the pressure sensor of FIG. 1 with a pedestal substrate added as a stress buffer.
Figure 9:
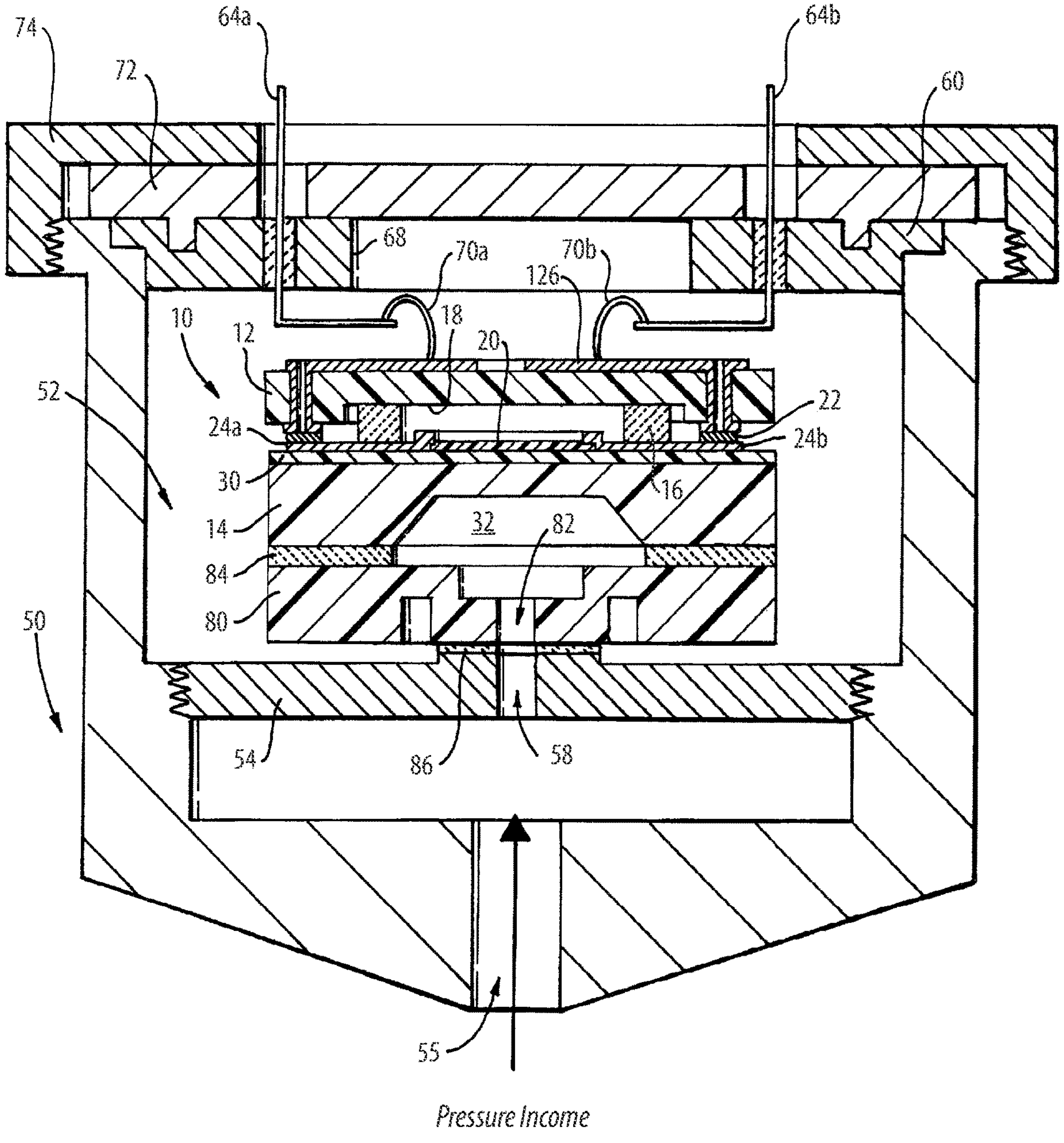
FIG. 9 is a cross-sectional view of the pressure sensor of FIG. 8 packaged in a housing assembly.

Referring to FIG. 8, there is illustrated the high-temperature pressure sensor 10 of FIG. 1, wherein a compliant pedestal substrate 80 with a pressure port 82 is additionally bonded to a bottom surface of the lower substrate 14 by way of a glass frit 84. Glass frit 84 has a bonding temperature equal to the bonding temperature of the glass frit 16 used to bond the upper substrate 12 to the lower substrate 14. As shown in FIG. 9, for packaging, a glass frit 86 is used to bond the pedestal 80 to the support surface if the base 54 in housing 50. Glass frit 86 has a lower bonding temperature than glass frits 16 and 84.

While the subject disclosure has been shown and described with reference to preferred embodiments, those skilled in the art will readily appreciate that changes and/or modifications may be made thereto without departing from the scope of the subject disclosure.

What is claimed is:

1. A packaged pressure sensor assembly comprising:

a pressure sensor including an upper substrate and a lower substrate bonded to one another by way of a first glass frit having a first bonding temperature, so as to define a hermetically sealed pressure sensing chamber therebetween;

a pedestal substrate directly below the lower substrate of the pressure sensor and spanning a width of the pressure sensor, wherein a bottom surface of the lower substrate of the pressure sensor is directly bonded to the pedestal substrate by way of a secondary glass frit, wherein the lower substrate of the pressure sensor and the pedestal substrate are aligned such that a pressure port in the pedestal substrate is aligned with a cavity defined by the lower substrate; and a housing defining an internal cavity having a base with a support surface for supporting the pressure sensor, wherein the pressure sensor is bonded to the support surface of the base through the pedestal substrate by a second glass frit having a second bonding temperature that is lower than the first bonding temperature.

2. The packaged pressure sensor assembly of claim 1, wherein a diaphragm is operatively associated with the hermetically sealed pressure sensing chamber for converting a mechanical stress to an electrical signal indicative of a sensed pressure.

3. The packaged pressure sensor assembly of claim 2, wherein the pressure sensor and the housing are adapted and configured to sense an absolute pressure.

4. The packaged pressure sensor assembly of claim 2, wherein the pressure sensor and the housing are adapted and configured to sense a differential pressure.

5. The packaged pressure sensor assembly of claim 2, wherein the housing includes a pair of electrical connectors for electrically communicating with the diaphragm.

6. The packaged pressure sensor assembly of claim 5, wherein bonding wires extend between the electrical connectors of the housing and a conductive bond pad associated with the upper substrate, and wherein the conductive bond pad communicates with electrical conductors connected to the diaphragm by way of a metallic layer deposited between the upper and lower substrates outboard from the first glass frit.

7. The packaged pressure sensor assembly of claim 5, wherein bonding wires extend between the electrical connectors of the housing and a conductive bond pad associated with the upper substrate, and wherein the conductive bond pad communicates with electrical conductors connected to the diaphragm by way of separate bonding wires outboard from the first glass frit.

8. The packaged pressure sensor assembly of claim 5, wherein bonding wires extend between the electrical connectors of the housing and electrical conductors connected to the diaphragm outboard from the first glass frit.

9. The packaged pressure sensor assembly of claim 1, wherein the base is threaded into the housing.

10. The packaged pressure sensor assembly of claim 6, wherein the metallic layer has a melting temperature that is less than the first bonding temperature.

11. The packaged pressure sensor assembly of claim 10, wherein the metallic layer is formed from an alloy having a melting temperature that is less than the first bonding temperature.

12. The packaged pressure sensor assembly of claim 11, wherein the metallic layer is a gold alloy.

13. The packaged pressure sensor assembly of claim 2, wherein the diaphragm has at least a piezo-resistive layer thereon made from a single silicon material or a polysilicon material.

14. The packaged pressure sensor assembly of claim 1, wherein the housing is formed from stainless steel and the base is formed from an alloy of nickel, cobalt and iron.

* * * * *